United States Patent [19]

Gogal

[11] 4,288,841

[45] Sep. 8, 1981

[54] DOUBLE CAVITY SEMICONDUCTOR CHIP CARRIER

[75] Inventor: John F. Gogal, Lebanon, N.J.

[73] Assignee: Bell Telephone Laboratories, Incorporated, Murray Hill, N.J.

[21] Appl. No.: 76,972

[22] Filed: Sep. 20, 1979

[51] Int. Cl.³ .................... H05K 7/06; H01L 25/00
[52] U.S. Cl. .................... 361/414; 361/401; 361/395; 174/52 FP; 339/17 R
[58] Field of Search ............ 357/74, 75; 339/17 CF, 339/17 N; 174/50.54, 52 FP; 361/380, 392–396, 401, 412, 414, 399, 409, 410, 417–420

[56] References Cited

U.S. PATENT DOCUMENTS

| | | | |
|---|---|---|---|
| 3,200,297 | 8/1965 | Gibson | 361/412 |
| 3,320,351 | 5/1967 | Glickman | 174/52 FP |
| 3,403,300 | 9/1968 | Horowitz | 361/414 |
| 3,579,046 | 5/1971 | Jordan | 361/412 |
| 3,588,852 | 6/1971 | McCormack | 361/412 |
| 3,777,220 | 12/1973 | Tatusko | 361/409 |
| 3,936,928 | 2/1976 | Hopp | 29/577 |
| 3,984,620 | 10/1976 | Robillard | 361/401 |
| 4,038,488 | 7/1977 | Lin | 174/52 FP |
| 4,167,647 | 9/1979 | Salera | 174/52 FP |

Primary Examiner—Gerald P. Tolin
Attorney, Agent, or Firm—H. W. Lockhart

[57] ABSTRACT

A semiconductor device including a double cavity semiconductor chip carrier 100 which comprises a multilayer ceramic sandwich structure having a pair of semiconductor chip receiving cavities in the opposite faces thereof. The package enables mounting and electrical interconnection of a pair of semiconductor integrated circuit chips in a package of the same size as that for a single chip and having somewhat greater thickness.

External terminals 93 on an outside face of the carrier are connected selectively by metallization paths 44, 53, 55, 83 integral with the carrier to chip mounting pads 41, 51 and to internal terminals 28 within the carrier. The internal terminals are disposed peripherally with respect to the chip cavities and adapted for interconnection with chip contact pads 26. Thus, a pair of unlike semiconductor integrated circuits can be interconnected in accordance with different patterns within a single package.

2 Claims, 2 Drawing Figures

4,288,841

DOUBLE CAVITY SEMICONDUCTOR CHIP CARRIER

BACKGROUND OF THE INVENTION

This invention relates to electronic component packaging and particularly to a ceramic carrier for housing and interconnecting a pair of semiconductor integrated circuit chips.

For most applications semiconductor integrated circuit chips are housed and interconnected in the now familiar dual-in-line package or close variants thereof. However, as the scale of integration has stepped up and the device density of the chips has increased there is greater need to improve and increase the compactness and efficiency of chip carriers. Carriers have been devised for mounting and connecting more than one chip as shown, for example, in U.S. Pat. No. 4,038,488. However, such tandem chip arrangements have not significantly reduced overall package dimensions or increased the degree of integration and density of packaged devices.

SUMMARY OF THE INVENTION

An embodiment in accordance with this invention is a semiconductor device including a carrier housing and interconnecting a pair of semiconductor integrated circuit chips comprising a ceramic member having a pair of semiconductor chip-receiving cavities disposed substantially coaxially in opposite faces thereof. Mounting means are provided in the carrier at the bottom of each cavity for mounting and electrically connecting one face of a semiconductor chip. The carrier has an array of external terminals on at least one face of the carrier and an array of internal terminals within the carrier and peripherally disposed with respect to each cavity and adapted for interconnection with contact pads on the adjacent semiconductor chip. Interconnecting means comprising metallization paths are provided integral with the carrier for interconnecting the chip mounting means, selected internal terminals and selected external terminals in accordance with a predetermined interconnect pattern.

More particularly, the ceramic member constituting the carrier is formed from a plurality of layers of ceramic chips which are shaped, metallized, and then stacked together in sandwich form and fired to make a unit. After mounting and interconnection of the semiconductor chips, the cavities are enclosed by sealed cover plates.

In a particular embodiment, the external terminals are metallized areas around the periphery of one face of the carrier. The particular array of these terminals is termed the "footprint" of the carrier. Typically, the carrier is connected electrically to other apparatus by mounting it on or in a circuit board or "mother" board so that the footprint contacts a corresponding array of terminals or connectors.

Metallization patterns on certain faces of the ceramic chips provide lateral interconnections within the carrier which then are at least partially embedded in the completed carrier. Vertical interconnection is provided within the carrier both by internal conductive vias and by metallized paths in grooves on the peripheral faces of the carrier. For a given design of chip carrier the interconnection patterns are fixed. Other interconnection patterns may be used for different carriers. However, for a particular design of carrier some variation in chip interconnection is attainable by virtue of the different matchups possible between the chip contact pads and the internal terminals.

Thus, a feature of the invention is a dual chip package having substantially the same contact footprint, and length and width dimensions as a single chip package.

A further feature is a dual chip package enabling selective interconnection of these chips to form a circuit or partial circuit within the carrier itself, thus increasing the degree of integration.

BRIEF DESCRIPTION OF THE DRAWING

The invention and its other features and objects will be more completely understood from the following detailed description taken in conjunction with the drawing in which.

DETAILED DESCRIPTION

Figure 1:
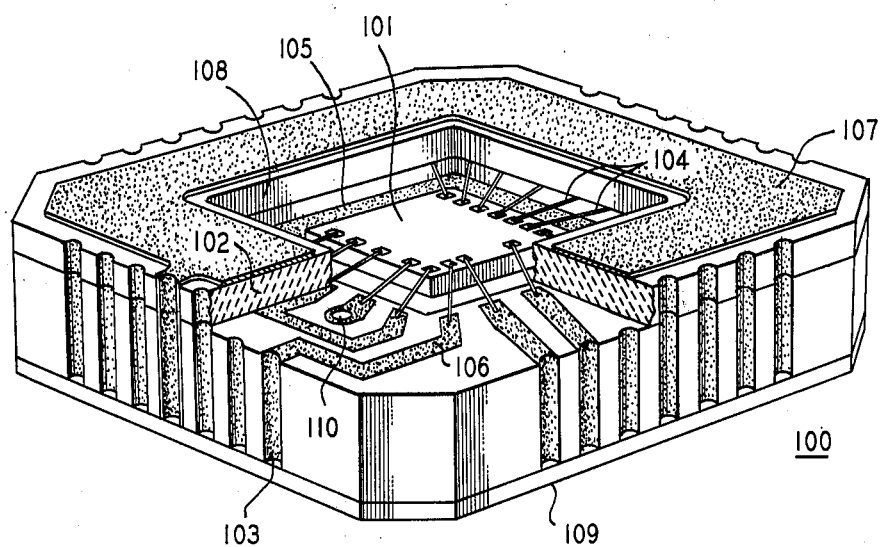
FIG. 1 is a perspective view, partially cut away of the assembled carrier without the sealed covers.

The perspective view of FIG. 1 of a double-cavity semiconductor chip carrier 100 in accordance with the invention is partially cut away to show a semiconductor chip 101 mounted in the upper cavity of the carrier. The second cavity similarly opens from the opposite or underface 109 of the carrier so that a second semiconductor chip is mounted in back-to-back relation with a ceramic layer between the chips. Although not shown, a cover member is sealed to the metallized area 107 to enclose the upper chip cavity and similar means are used to enclose the lower cavity by sealing to the metallized area indicated by the dotted outline 82 on ceramic chip 80 of FIG. 2.

The semiconductor chip 101 is mounted to a metallized area 105 in the bottom of cavity 108 and wire leads 104 connect from contact pads on the semiconductor chip to the internal terminal portions of metallization patterns 106 on the carrier. Vertical interconnection within the carrier is effected by the metallized grooves or castellations 103 and by conductive vias 110. These interconnection means and combinations of such means will be disclosed in more detail hereinafter in connection with the description of FIG. 2.

Figure 2:
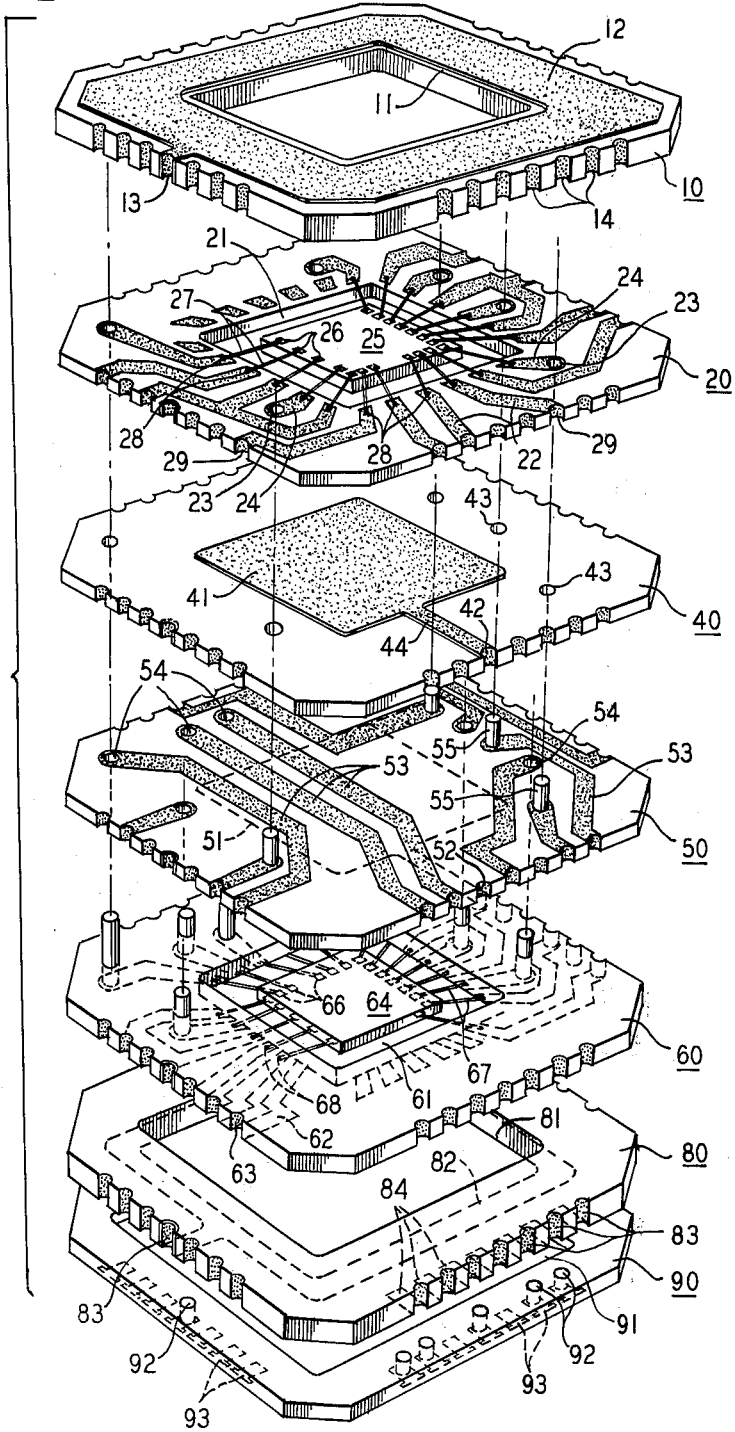
FIG. 2 is a view, in perspective, analogous to an exploded view, of the parts of a double-cavity semiconductor chip carrier before their assembly, and including a pair of semiconductor chips in relative position.

FIG. 2 is a perspective view of the series of ceramic chips which, when assembled, comprise the double cavity semiconductor chip carrier device in accordance with this invention. Each of the ceramic chips 10, 20, 40, 50, 60, 80, 90 is a green or uncured ceramic member essentially of alumina ($Al_2O_3$). Typically, one suitable ceramic used for this purpose is 7231A green ceramic sheet marketed by Plessey Frenchtown, Frenchtown, New Jersey. This ceramic material is furnished in sheets which are shaped by pressing, molding, and punching to conform to the configurations of the various chip shown in FIG. 2.

In addition to the shaping operations as required, the ceramic chips 10, 20, 40, etc., are provided with metallization patterns to produce the desired electrical interconnections within the carrier as well as the internal and external terminals for making connection to the electrodes on semiconductor chips and for interconnecting the carrier to external circuitry. Typically these metallization areas are produced by deposition using masking or screening techniques to apply successive layers of suitable metals. In this specific embodiment, the metallized areas comprise a composite layer of tungsten applied directly to the ceramic, covered with a layer of nickel and finally a layer of gold. Vertical interconnection also is provided by internal vias comprising vertical holes which are filled with a metallic paste which is converted to a solid electrically conductive form.

The two chip-receiving cavities of the double cavity carrier are defined each by the combination of annular ceramic chips and a solid mounting chip. Thus, one cavity is formed by ceramic chips 10 and 20 having respective central openings 11 and 21 mounted on ceramic chip 40 which has the mounting means at the bottom of the cavity comprising the mounting pad 41. Similarly, the downward facing cavity is formed by ceramic chips 80 and 60 having respective openings 81 and 61 and mounting chip 50 including the mounting pad defined by broken line 51.

Semiconductor chips 25 and 64 are shown with wire leads 27–67 interconnecting chip contact pads 26, 66 and internal terminals 28–68 at the level at which they are positioned in the completed carrier. Typically, these wire leads are attached by wire bonding techniques such as thermocompression bonding or ultrasonic bonding. Each semiconductor chip further is mounted and connected to its appropriate mounting pad. It will be understood that mounting and interconnection of the semiconductor chips is done in the assembled carrier.

In this specific embodiment, the peripheral edges of the ceramic chips contain a series of notches or grooves, such as the grooves 14 of the chip 10. These grooves, termed castellations, are metallized to provide conductive runs on the outer edges of the assembled carrier. Vertical interconnection within the carrier also is provided by means of internal vias 55 shown in connection with chip 50. The vias are made by filling selectively formed holes in the ceramic chips with a metallic paste which during the ceramic firing process results in the pipe-like electrically conductive vias. The extent and location of vias is determined by the location and alignment of holes 23 in chip 20 and holes 43 in chip 40, for example.

Horizontal interconnection within the carrier is provided primarily by the metallized leads 22 on chip 20, leads 53 on chip 50, for example, which largely are embedded in the completed carrier.

Thus, to recapitulate, for the specific embodiment of FIG. 2, annular ceramic chip 10 defines, in part, the upper cavity and includes a metallized area 12 on the top surface to which a coverplate is sealed. The metallized area 12 is shown connected to edge castellation 13 for electrical grounding and shielding purposes where desirable.

Ceramic chip 20 corresponds to the level at which the upper semiconductor chip 25 is mounted and includes on its upper surface an array of metallized leads 22. The innermost ends of these metallized leads 22 constitute internal terminals 28 disposed around the periphery of the cavity containing the semiconductor chip 25. As previously noted, interconnection between contact pads 26 on the semiconductor chip and the terminals 28 are made by means of wire leads 27 which typically are wire bonded to both contacts. Certain of the metallized leads 22 connect to the peripheral castellations 29, for example. Other of the metallized leads 24, for example, encompass a via hole 23. Thus, the horizontal metallized leads may connect either to the peripheral metallized castellations or to vias or both, for vertical interconnection. These arrangements provide great flexibility in formulating interconnection patterns with the double-cavity chip carrier in accordance with this invention. Largely for reasons relating to ease of fabrication the underside of chip 20 does not contain metallized leads except for emerging vias. Generally, in this specific embodiment the ceramic chips have metallized leads on only one face of the chips except for the central layer chip 50, described specifically hereinafter.

Ceramic chip 40 is a solid, rather than annular, chip and the metallized area 41 is the so-called mounting area for the semiconductor chip 25 and thus is the bottom of the upward facing chip cavity. Shown also are via holes 43 and peripheral castellations 42, to one of which the metallized area 41 is connected by means of metallized lead 44.

Ceramic chip 50, as noted above, is the central layer of the carrier and has on its upper surface metallized leads 53 and vias 55 occupying via holes 54. It will be understood that although the vias 55 are shown with rod-like appearance, they do not exist separately in this form. They are shown in this fashion to indicate their electrically conductive function. The metallized leads 53 on ceramic chip 50 are shown interconnecting vias 55 and peripheral conductive castellations 52. They may also interconnect vias or peripheral castellations or both. On the underface of chip 50 dotted outline 51 indicates the chip-mounting area for semiconductor chip 64 which is mounted in the lower facing cavity of the carrier. As in the case of chip-mounting area 41, area 51 likewise is connected to a vertical interconnect which may be to the same peripheral castellation 52 or to a different connection.

Annular ceramic chip 60 defines, in part, the lower chip cavity and is similar in structure and function to ceramic chip 20. The metallized leads 62 on the underface of chip 60 are not identical, necessarily, to those provided on the upper face of ceramic chip 20.

In this specific embodiment, ceramic chip 80 is somewhat analogous to ceramic chip 10 in that dotted outline 82 represents a metallized area on the underface of the chip to which the lower cover member, not shown, may be attached, typically by a metal-to-metal hermetic seal in the same manner as the top cover.

However, in this embodiment there is an additional annular ceramic chip 90 below chip 80 which has the primary function of carrying the external terminals 93 shown in dotted outline as metallized areas on the underface of chip 90. These terminals 93, arranged around the periphery of the chip are referred to, in the aggregate, as the contact footprint of the carrier. As external terminals they enable contact to corresponding contact arrays in apparatus boards of various types. In one embodiment, the external terminals 93 contact solder bumps on the face of a mounting board which ensure clearance between the underside of the carrier and the surface of the apparatus board.

Connection from the conductive circuits of the upper portion of the carrier to the external terminals 93 is made from the peripheral castellations 83 of chip 80 to short metallized leads 84 on the underface of chip 80. Vertical connection through chip 90 then is made by means of short vias 92 which contact the external terminals 93. In this specific embodiment, chip 90 has no peripheral constellations and the non-indented periphery of this chip acts as a solder stop to prevent solder flow up the castellations when the lower contact face of the carrier is solder dipped. It is possible, of course, in the alternative to provide peripheral conductive castellations on chip 90, particularly if a solder stop is not necessary.

Alternative embodiments also are possible in which either the vias or the peripheral castellations are omitted entirely from the carrier. For such arrangements, either conductive vias or peripheral castellations alone are relied upon for vertical interconnection.

As can be seen from the relative dimensions, the cover member for the lower cavity of the carrier fits within the opening 91 of chip 90 and thus, does not protrude below the under or contact face of chip 90. In this connection, it will be understood that hermetically sealed cavities may not always be required and a cover member may be omitted or be of the non-hermetic type for mechanical protection only.

When the series of ceramic chips 10, etc., are sandwiched together and the via holes filled with the metallic paste, the assembly is fired to produce a unitary member comprising the double cavity semiconductor chip carrier. In the unitary assembly interconnections may be made from particular contact pads on each of the mounted semiconductor chips through the various metallization leads to terminate in certain of the external terminals 93 on the bottom face of the carrier. Interconnection between particular contact pads on the semiconductor chips also can be made. It will be evident that, in the typical instance, in which both semiconductor chips are of the integrated circuit type a considerable flexibility of interconnection is possible, even for a given design of carrier. In particular, computer programming can be used to determine the interconnection pattern for particular semiconductor devices which are paired in particular double cavity carriers of this general configuration. Within the general carrier configuration, as previously noted, various designs may be fabricated to have different interconnection arrangements. These different arrangements may be obtained by relatively simple variations in metallization masks and via patterns.

The perspective view of FIG. 1 illustrates the carrier in its assembled form showing the upper cavity with a semiconductor chip installed therein. It will be apparent that the overall length-width dimensions of the carrier are similar to those for a single chip carrier while the double cavity carrier requires only slightly greater thickness than that used for a single chip carrier. Thus the double cavity chip carrier can be fitted into recesses which are not substantially greater than those previously required for single chip carriers thereby greatly increasing the device density attained in particular circuit apparatus. As set forth above the feature relating to interconnection flexibility with the double cavity chip carrier greatly increases the degree of integration attainable without changes in device designs and standards.

Moreover, although the double cavity carrier is described as a semiconductor chip carrier, and particularly in terms of an integrated circuit chip, it will be appreciated that other similar electronic elements may be included. For example, the mounted elements may include discrete semiconductor devices, capacitors, resistors, and piezoelectric devices. In particular, a double-cavity carrier may include an integrated circuit chip and a crystal unit, or an MOS capacitor and a hybrid integrated circuit.

I claim:

1. A semiconductor device including a double cavity semiconductor chip carrier and a pair of semiconductor chips enclosed in said carrier, an array of internal terminals around each cavity, and an array of external terminals on a surface of said carrier, each of the semiconductor chips having an array of contacts pads on one major surface,

CHARACTERIZED IN THAT the chips carrier is made of insulative material and comprises a plurality of layers of ceramic chips fused into a unitary body having a pair of cavities coaxially disposed in opposite faces thereof, metallization patterns are defined on a horizontal surface of each of a plurality of said layers, and said layers provide (1) lateral interconnections at least partially embedded in said unitary body and (2) separate mounting and connection means to the surface of each of said semiconductor chips opposite the said one major surface, certain of said lateral interconnections are connected to said internal terminals, certain lateral interconnections are connected to said separate mounting and connecting means, wire conductors interconnect contact pads on said semiconductor chips and certain of said internal terminals, a plurality of vertical interconnecting means each extend through a plurality of said layers to interconnect certain lateral interconnections to certain external terminals.

2. A semiconductor device in accordance with claim 1 in which the vertical interconnecting means includes vertically disposed conductive vias embedded in the carrier and metallized grooves vertically disposed in the peripheral faces of the carrier.

* * * * *